United States Patent
Alpert et al.

(10) Patent No.: US 9,092,591 B2
(45) Date of Patent: *Jul. 28, 2015

(54) AUTOMATIC GENERATION OF WIRE TAG LISTS FOR A METAL STACK

(71) Applicant: International Business Machines Corporation, Armonk, NY (US)

(72) Inventors: Charles J. Alpert, Austin, TX (US); Robert M. Averill, III, Wappingers Falls, NY (US); Eric J. Fluhr, Round Rock, TX (US); Zhuo Li, Cedar Park, TX (US); Tuhin Mahmud, Austin, TX (US); Jose L. P. Neves, Poughkeepsie, NY (US); Stephen T. Quay, Austin, TX (US); Chin Ngai Sze, Austin, TX (US); Yaoguang Wei, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/249,765

(22) Filed: Apr. 10, 2014

(65) Prior Publication Data

US 2014/0223397 A1    Aug. 7, 2014

Related U.S. Application Data

(63) Continuation of application No. 13/737,231, filed on Jan. 9, 2013, now Pat. No. 8,769,468.

(51) Int. Cl.
*G06F 17/50* (2006.01)

(52) U.S. Cl.
CPC .......... *G06F 17/5077* (2013.01); *G06F 17/505* (2013.01)

(58) Field of Classification Search
USPC ........................................................ 716/130
See application file for complete search history.

(56) References Cited

U.S. PATENT DOCUMENTS

| 5,151,867 | A  * | 9/1992  | Hooper et al. ................ 716/104 |
| 6,189,131 | B1   | 2/2001  | Graef et al. |
| 6,560,752 | B1   | 5/2003  | Alpert et al. |
| 6,587,991 | B1   | 7/2003  | Mbouombouo et al. |
| 6,817,000 | B2 * | 11/2004 | Rich et al. ..................... 716/108 |
| 7,853,915 | B2   | 12/2010 | Saxena et al. |
| 7,895,557 | B2   | 2/2011  | Alpert et al. |
| 7,984,406 | B2   | 7/2011  | Akamine et al. |

(Continued)

OTHER PUBLICATIONS

U.S. Appl. No. 13/737,231.

(Continued)

*Primary Examiner* — Jack Chiang
*Assistant Examiner* — Brandon Bowers
(74) *Attorney, Agent, or Firm* — Francis Lammes; Stephen J. Walder, Jr.; William J. Stock

(57) ABSTRACT

Mechanisms are provided for pruning a layer trait library for use in wire routing in an integrated circuit design process. The mechanisms receive a plurality of wirecodes and a metal stack definition. The mechanisms generate a verbose layer trait library based on all possible combinations of the wirecodes and layers of the metal stack definition. The mechanisms generate a pruned layer trait library by pruning the verbose layer trait library to remove redundant layer traits from the verbose layer trait library. In addition, the mechanisms store the pruned layer trait library for performing wire routing of an integrated circuit design.

19 Claims, 7 Drawing Sheets

(56) References Cited

U.S. PATENT DOCUMENTS

| | | |
|---|---|---|
| 7,996,808 B2 | 8/2011 | Arp et al. |
| 8,127,260 B1 | 2/2012 | Song et al. |
| 8,370,783 B2 | 2/2013 | Uchino et al. |
| 2005/0097488 A1* | 5/2005 | Lakshmanan et al. ............ 716/7 |
| 2009/0106709 A1* | 4/2009 | Carney et al. ..................... 716/2 |
| 2011/0252391 A1 | 10/2011 | Arimoto |
| 2012/0240093 A1 | 9/2012 | Alpert et al. |

OTHER PUBLICATIONS

"A method to efficiently use unbalanced layer stacks to reduce timing and routing variation", ip.com, IPCOM000215402D, Feb. 26, 2012, 1 page.

Moffitt, Michael D. et al., "Wire Synthesizable Global Routing for Timing Closure", IEEE, 2011, pp. 545-550.

\* cited by examiner

AUTOMATIC GENERATION OF WIRE TAG LISTS FOR A METAL STACK

BACKGROUND

The present application relates generally to an improved data processing apparatus and method and more specifically to mechanisms for automatically generating a list of wire tags for chip design optimization and routing for a given technology metal stack.

Modern day electronics include components that use integrated circuits. Integrated circuits are electronic circuits formed using silicon as a substrate with added impurities to form solid-state electronic devices, such as transistors, diodes, and resistors. Commonly known as a "chip", an integrated circuit is generally encased in hard plastic. The components in modern day electronics generally appear to be rectangular black plastic pellets with connector pins protruding from the plastic encasement.

Circuit designers use a variety of software tools to design electronic circuits that accomplish an intended task. For example, a digital circuit may be designed to accept digital inputs, perform some computation, and produce a digital output. An analog circuit may be designed to accept analog signals, manipulate the analog signals, such as my amplifying, filtering, or mixing the signals, and produce an analog or digital output. Generally, any type of circuit can be designed as an integrated circuit (IC).

The software tools used for designing ICs produce, manipulate, or otherwise work with the circuit layout at very small scales. Some of the components that such a tool may manipulate may only measure tens of nanometer across when formed in silicon. The designs produced and manipulated using these software tools are complex, often including millions of such components interconnected to form an intended electronic circuit. Such an interconnected group of components is called a net.

The software tools manipulate these components at the components level, or at the level of blocks of components, i.e. block level. A block of components is also known as a cell. One way of identifying cells in an IC design is to overlay a grid of imaginary vertical and horizontal lines on the design, and deeming each portion of the IC design bound by horizontal and vertical lines as a cell. The horizontal or vertical lines bounding a cell are called cut-lines. Cells formed in this manner are commonly known as global routing cells, or g-cells. Imposing such a grid on an IC design abstracts the global routing problem away from the actual wire implementation and gives a more mathematical representation of the task. A net may span one or more cells and may cross several cut lines.

An IC design software tool can, among other functions, manipulate cells, or interconnect components of one cell with components of other cells, so as to form nets. The interconnects between components are called wires. A wire is a connection between parts of electronic components, and is formed using a metallic material that conducts electricity.

One aspect of IC design is referred to as the placement problem, i.e. the problem of placing the cells of a chip such that the design meets all the design parameters of the chip. Routing is the process of connecting the pins after placement. In other words, placement results in a rendering of the components of various cells as being located in certain positions in the design, whereas routing results in a rendering of how the metal layers would be populated with that placement. A wire can be designed to take any one of the several available paths in a design. Placement of a wire on a certain path, or track, is a part of routing.

A layer is typically designated to accommodate wires of a certain width, (wirecode). Generally, the wider the wire width of a layer, and the thicker the wire height of a layer, the faster the signal propagation speed for the net routed on that layer. Faster layers, to wit, layers with larger wire widths or higher wire height, can accommodate fewer components or nets as compared to slower layers with narrower wire widths.

A router is a component of an IC design tool that performs the routing function. Once the placement component, known as a "placer," has performed the placement function, the router attempts to connect the wires without causing congestion. For example, if a design parameter calls for no more than five wires in a given area, the router attempts to honor that restriction in configuring the wiring. Such limitations on the wiring are a type of design constraints and are called congestion constraints. Other types of design constraints may include, for example, blocked areas—cell areas where wires may not be routed.

A global router divides the routing region into small tiles and attempts to route nets through the tiles such that no tile overflows its capacity. After global routing, wires must be assigned to actual tracks within each tile, followed by detail routing which must connect each global route to the actual pin shape on the cell. Another type of router, known as the "detailed router," performs the detailed routing. The global and detailed routing produced during the design process is collectively referred to as "routing" and is usually further modified during optimization of the design.

SUMMARY

In one illustrative embodiment, a method, in a data processing system, is provided for pruning a layer trait library for use in wire routing in an integrated circuit design process. The method comprises receiving a plurality of wirecodes and a metal stack definition. The method also comprises generating a verbose layer trait library based on all possible combinations of the wirecodes and layers of the metal stack definition. The method further comprises generating a pruned layer trait library by pruning the verbose layer trait library to remove redundant layer traits from the verbose layer trait library. In addition, the method comprises storing the pruned layer trait library for performing optimization (such as repeat insertion) and wire routing of an integrated circuit design.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

Figure 1:
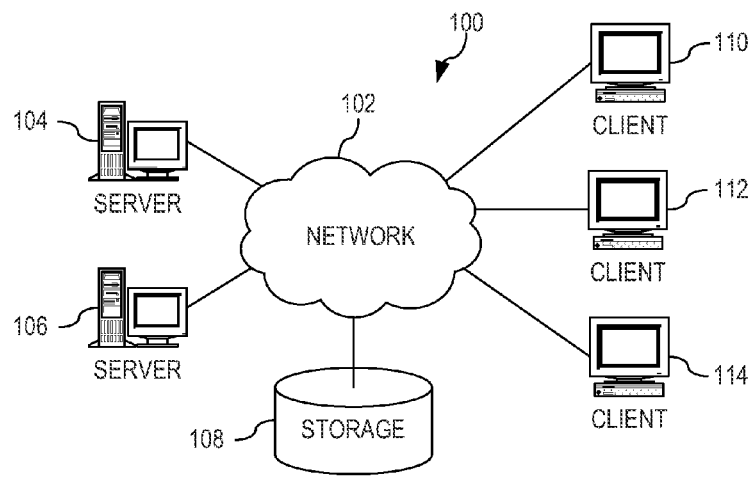
FIG. 1 is an example diagram of a distributed data processing system in which aspects of the illustrative embodiments may be implemented.

The illustrative embodiments provide mechanisms for automatically generating a list of wire tags for chip design optimization and routing for a given technology metal stack. The mechanisms of the illustrative embodiment, for a given technology metal stack, determines an initial verbose full layer trait list by exploring all layers of the metal stack and all possible wirecodes for the technology stack. This initial verbose full layer trait list is then pruned according to timing and congestion costs. Different levels of a layer trait library are built from the pruned layer trait list through clustering non-redundant layer traits based on different requirements at different stages of the design flow. A more coarse layer trait library may be used early on in the design flow while a more fine grain layer trait library may be used in later stages of the design flow.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 2:
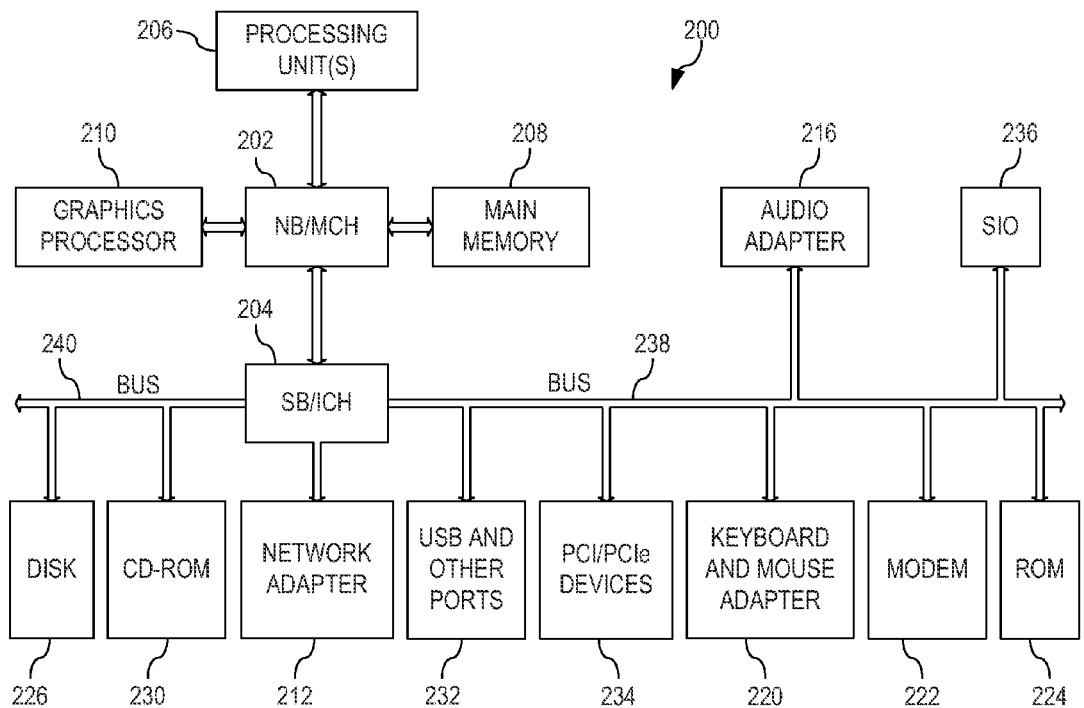
FIG. 2 is an example block diagram of a computing device in which aspects of the illustrative embodiments may be implemented.

Thus, the illustrative embodiments may be utilized in many different types of data processing environments. In order to provide a context for the description of the specific elements and functionality of the illustrative embodiments, FIGS. 1 and 2 are provided hereafter as example environments in which aspects of the illustrative embodiments may be implemented. It should be appreciated that FIGS. 1 and 2 are only examples and are not intended to assert or imply any limitation with regard to the environments in which aspects or embodiments of the present invention may be implemented. Many modifications to the depicted environments may be made without departing from the spirit and scope of the present invention.

FIG. 1 depicts a pictorial representation of an example distributed data processing system in which aspects of the illustrative embodiments may be implemented. Distributed data processing system 100 may include a network of computers in which aspects of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like.

In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

FIG. 2 is a block diagram of an example data processing system in which aspects of the illustrative embodiments may be implemented. Data processing system 200 is an example of a computer, such as client 110 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash basic input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft® Windows 7®. An object-oriented programming system, such as the Java™ programming system, may run in conjunction with the operating system and provides calls to the operating system from Java™ programs or applications executing on data processing system 200.

As a server, data processing system 200 may be, for example, an IBM® eServer™ System P® computer system, running the Advanced Interactive Executive (AIX®) operating system or the LINUX® operating system, Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1 and 2 may vary depending on the implementation. Other internal hardware or peripheral devices, such as flash memory, equivalent non-volatile memory, or optical disk drives and the like, may be used in addition to or in place of the hardware depicted in FIGS. 1 and 2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device that is configured with flash memory to provide non-volatile memory for storing operating system files and/or user-generated data, for example. Essentially, data processing system 200 may be any known or later developed data processing system without architectural limitation.

Referring again to FIG. 1, one or more of the server computing devices 104, 106 may operate to provide VLSI design mechanisms that may include the mechanism of the illustrative embodiment employed to assist in simplifying synthesis and wire routing design flows. The data for use in performing the operations of the mechanisms of the illustrative embodiments may be provided in storage systems associated with the server computing devices 104, 106, stored in network attached storage 108, or provided by client computing devices 110-114 which may communicate with the servers 104, 106 via the network 102, such as to provide user input to configure or otherwise direct the operation of the VLSI design mechanism.

The VLSI design mechanism of the server 104, 106 includes a layer trait library pruning mechanism in accordance with the illustrative embodiments. The layer trait library pruning mechanism reduces the size of the layer trait library considered when performing synthesis and wire routing as part of the VLSI design flow. The implementation of the layer trait library pruning mechanism operates based on the observation that the runtime of optimization tools used in synthesis and wire routings is proportional to the number of layer traits considered during the execution of the optimization tool. Thus, the layer trait library pruning mechanism of the illustrative embodiments seeks to reduce the size of the layer trait library while still including appropriate layer traits to cover the desired technology metal stack wiring possibilities that are non-redundant and have the lowest timing and congestion values, and the best parasitic (RC) values.

Figure 3:
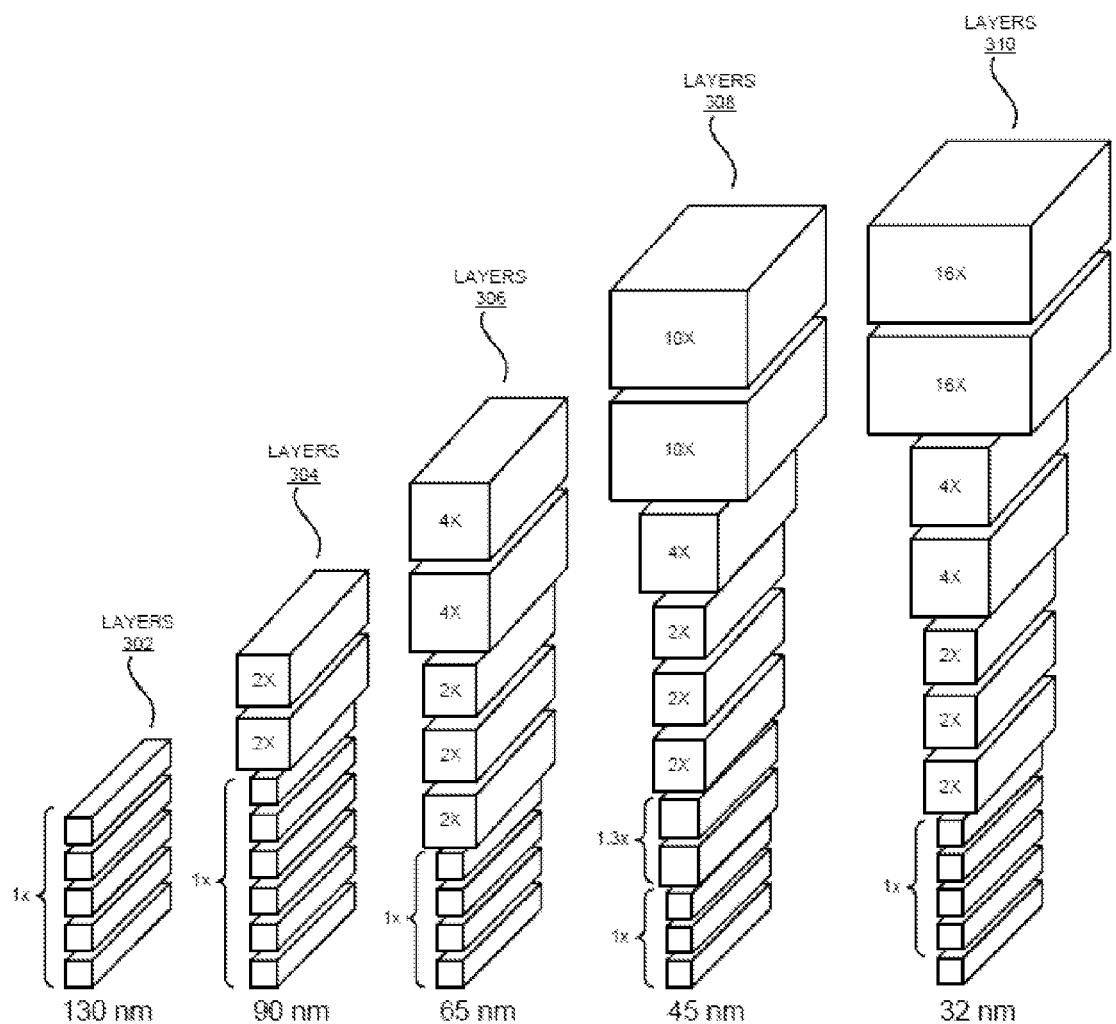
FIG. 3 is a block diagram of various types of layers in an integrated circuit (IC) design with respect to which an illustrative embodiment may be implemented is illustrated.

With reference now to FIG. 3, a block diagram of various types of layers in an integrated circuit (IC) design with respect to which an illustrative embodiment may be implemented is illustrated. The particular set of metal layers actually used in an IC design is based on the particular technology used in the design. Wider and thicker metal stacks allow for larger wirings and reduce resistance. Referring to FIG. 3, routing can be performed on layers 302, 304, 306, 308, or 310 using a wire routing tool or a VLSI design mechanism, such as may be executed on one or more of the servers 104, 106 in FIG. 1.

As an example, the half pitch of a typical memory cell may be 45 nm. The minimum metal width on a 1× layer is usually approximately two times that half pitch, thus equaling approximately 90 nm in this example. A 1.3× layer accommodates a route width that is one hundred thirty percent of the width on a 1× layer. Similarly, a 2× layer accommodates a route width that is twice the width on a 1× layer. A 4× layer accommodates a route width that is four times the width on a 1× layer. A 10× layer accommodates a route width that is ten times the width on a 1× layer. A 16× layer accommodates a route width that is sixteen times the width on a 1× layer. In fact, the thickness of different layers is different, which is another reason why the layers have different propagation speeds.

Layers 302 represent a set of 1× layers as is typically available for routing a 130 nanometer (nm) IC design. Layers 304 represent a set of 1× layers and 2× layers as is typically available for routing a 90 nanometer (nm) IC design. Layers 306 represent a set of 1× layers, 2× layers, and 4× layers, as is typically available for routing a 65 nanometer (nm) IC design. Layers 308 represent a set of 1× layers, 1.3× layers, 2× layers, 4× layers, and 10× layers, as is typically available for routing a 45 nanometer (nm) IC design. Layers 310 represent a set of 1× layers, 2× layers, 4× layers, and 16× layers, as is typically available for routing a 32 nanometer (nm) IC design.

A wider route width translates into a faster net, which means an electrical signal transmits faster on such a net. Accordingly, the signal on a net routed on a 2× layer will be faster than the signal on the same net on a 1× layer; a net routed on a 4× layer will be faster than the same net on a 2× layer; and so on.

A faster layer also has scarcer resources. In other words, a faster layer accommodates fewer components due to the larger route widths. Therefore, even when fast nets are desirable, such as for meeting a timing constraint, not all the nets can be placed on the fastest (top) layers, as doing so will cause increased congestion on those layers. Placing the nets on slower (lower) layers may reduce the congestion problem, but causes the nets to perform comparatively slower. To meet timing constraints with slow nets, the nets have to be buffered, causing increased power consumption and design area.

A modern IC design can contain up to tens of millions of nets. A designer usually assigns layer constraints to a fraction of these nets, ranging from few hundred nets, to tens of thousands or even more to achieve the timing closure. For designs with frequency at 3 to 5 G Hz, there could be more than 20% of nets with layer constraints. The optimization step of the IC design process cannot predict what layers the router will select for the given nets.

If the optimization step takes a pessimistic approach and assumes that the wiring router will place the net on slower layers, the optimization step introduces buffers in the nets to overcome timing delays due to placement on the slower layers. By doing so, the circuit optimizer increases the power consumed and the area occupied by the design. If the optimizer takes an optimistic approach and assumes that the router will place the nets on the higher layers, the optimizer is faced with congestion on the higher layers and a hard-to-recover post-routing timing problem. Thus, there is a need to perform a tradeoff between congestion and timing when performing routing of wires in an IC design.

Figure 4:
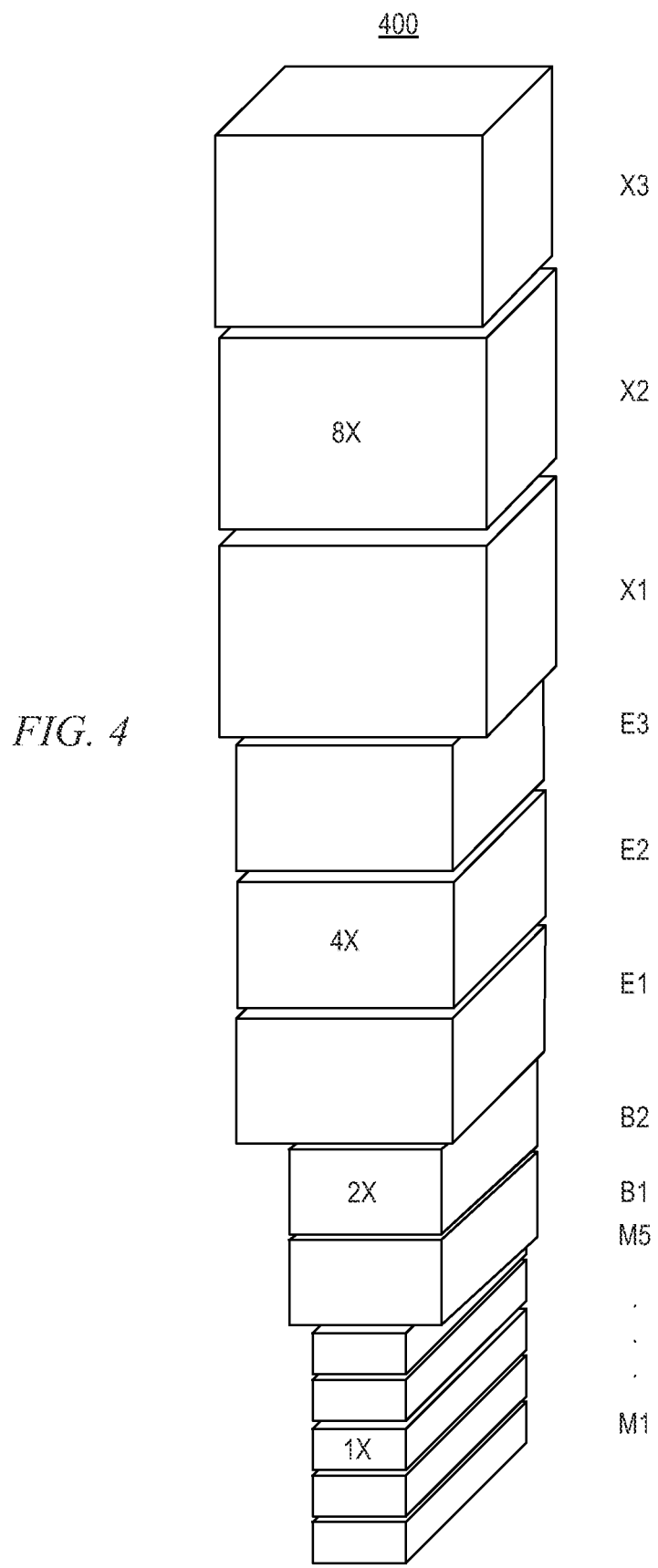
FIG. 4 is a block diagram of a single metal stack for a given technology used to explain the definition of a layer trait in accordance with one illustrative embodiment.

FIG. 4 is a block diagram of a single metal stack for a given technology used to explain the definition of a layer trait in accordance with one illustrative embodiment. As shown in FIG. 4, the metal stack 400 is comprised of a plurality of metal layers which may have different widths/thicknesses, similar to that shown in FIG. 3, for example. Traversing from bottom to top of the metal stack 400, the lower layers M1-M5 represent a thinnest metal layer (1× layer), where "lx" means a single width/spacing, "2×" means a double width/spacing, "4×" is a quadruple width/spacing, and so on. These lower layers have relatively the worst resistance-capacitance (RC) parasitics for routing purposes. The second set of layers, designated B1 to B2, are of a 2× layer type, followed by the third set of layers, designated E1 to E3, which are 4× metal layers. Finally, the thickest metal layers X1 to X3 are 8× metal layers in this example.

With this type of metal stack 400 arrangement, the layer trait defines the routing layer [L, U] (where L is the lower layer and U is the upper layer) and the wirecode that defines the wire width and spacing on every layer. The layer trait is essentially a contract between wire routing optimizations and synthesis tools. That is the range [L, U] is the hard constraint for the wire router to obey. Synthesis uses RC on the lower layer L and the next higher layer L+1 for timing estimation using, for example, a Steiner tree based timing and buffer insertion algorithm. One can also use the average RC value of all layers, or a certain set of layers, for timing estimation and optimization.

An example of a layer trait may be of the type W10S10L1D M2 X3. The "W10S10L1D" is the wirecode while the "M2 X3" is the layer range [L, U]. The "W10" indicates that wires corresponding to this layer trait have a 1× width and the "S10" indicates that the wires have a spacing of 1×. The "L1D" indicates layers 1 to D (in hexadecimal format—D corresponding to metal layer X3 in FIG. 4). The wirecode is used by the wiring router when performing wiring optimizations on the IC design. For purposes of synthesis, in this wirecode example, the M2 and M3, i.e. the L and L+1, layers of the stack 400 are used to determine the RC parasitics of the IC design for Steiner tree timing and buffer insertion optimizations. Without loss of generality, the Steiner routes could also use other ways to determine the RC parasitics, such as an average of all layers.

As another example of a layer trait, consider the layer trait W20S20L17 B1 X3. The layer range B1 to X3 indicates that below layer B1 only a via is present for this layer trait and the wirecode indicates that this via has a width of 2×. The wires on layers B1 to B2 (i.e. layer 7 in the "L17" portion of the wirecode) have 2× width and spacing and wires on higher layers than B2 have single width and spacing, by a default setting. That is, if the width for a layer is not specified in the layer trait, then a default setting may be utilized which, for example, may be set to a single width or other pre-defined width setting. One could also augment the definition and make sure all layers are covered, such as W20S20L17_W10S10L8D, for example. In this example, for purposes of the Steiner timing and buffer insertion optimizations, the double width/spacing of layers B1 and B2, i.e. layers L and L+1, are used to estimate the RC parasitics for the IC design, or the average of other layers if one used a different Steiner estimation methodology.

It should be appreciated that for a specified technology, e.g., a specified metal stack configuration such as one of the stacks for 32 nm to 130 nm in FIG. 3, there may be a large number of possible layer traits that may be used when performing wire routing optimization and synthesis. Typically a verbose full layer trait list is generated by exploring all layers and possible wirecodes for the given technology metal stack. The synthesis runtime, however, is linear to the number of layer traits considered. Thus, in order to reduce synthesis runtime, it is desirable to reduce the number of layer traits considered during synthesis. The present invention provides a mechanism for pruning the verbose full layer trait list to thereby reduce synthesis runtime.

Figure 5:
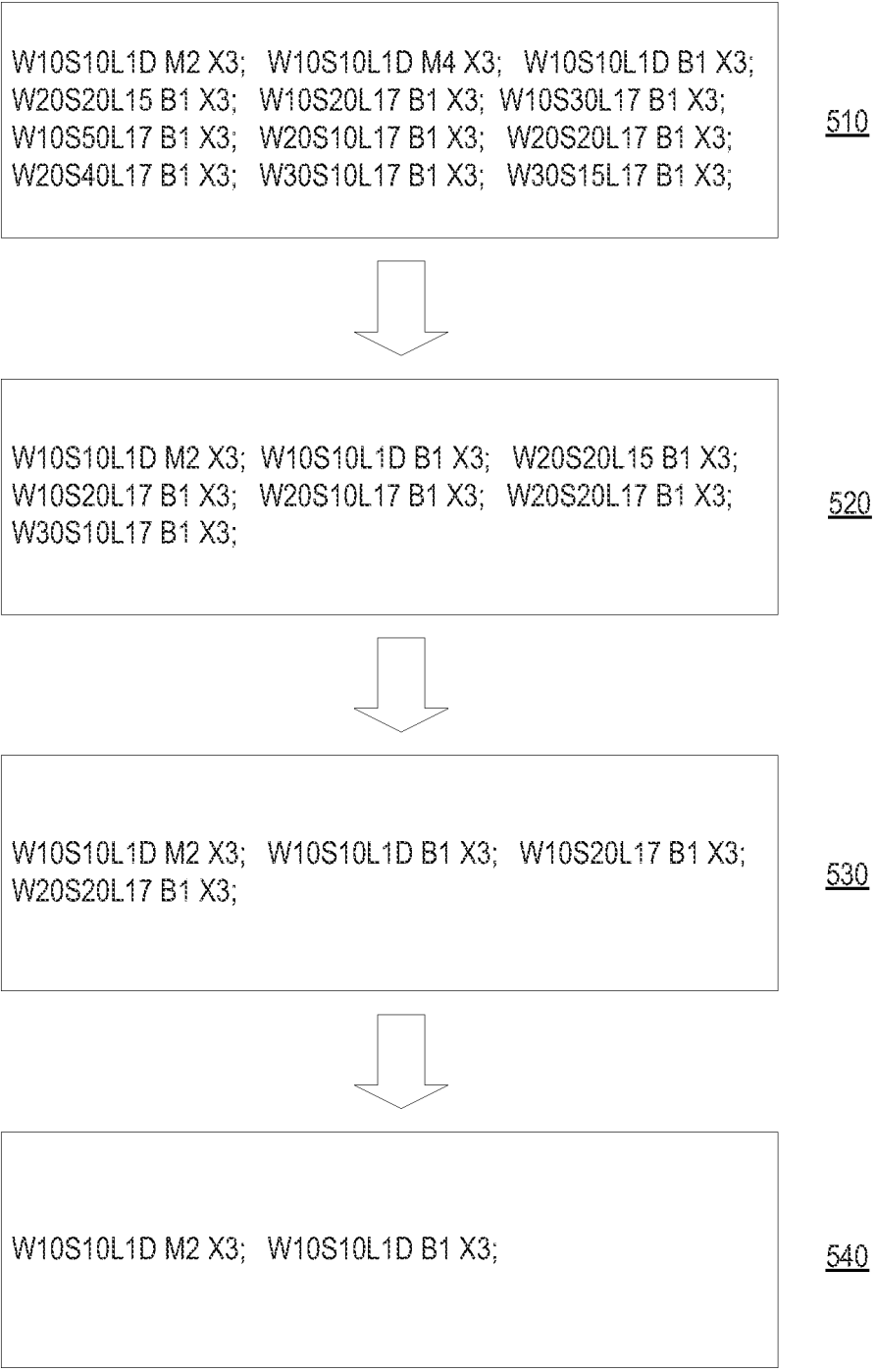
FIG. 5 which illustrates various layer trait listings at different levels of pruning in accordance with one illustrative embodiment.

To illustrate the operation of the layer trait list pruning mechanisms of the illustrative embodiments, consider FIG. 5 which illustrates various layer trait listings at different levels of pruning in accordance with one illustrative embodiment. A general overview description of this pruning process is provided here with reference to FIG. 5 and a more detailed explanation of the mechanisms for performing the pruning operation is provided thereafter.

As shown in FIG. 5, an initial layer trait listing 510, in this example, includes 12 layer traits. This initial layer trait listing 510 may be obtained, for example, as described previously, by exploring all combinations of all existing wirecodes and layer traits. Some of these layer traits have the same or substantially similar RC parasitic characteristics and thus, an initial pruning operation removes these redundant layer traits from the layer trait listing to generate first pruned layer trait listing 520. The particular layer trait to keep in the first pruned layer trait listing 520 may be determined based on an analysis of the characteristics associated with the layer traits and comparison to identify which of the redundant layer traits provides better characteristics for wire routing and synthesis.

It should be noted that the RC parasitic of each layer trait is known based on the technology profile associated with the IC design. For example, one can simulate the delay of a given length of a wire segment on a layer and determine the delay value of this wire. If, in doing so, one wire is determined to be of layer trait A, and another wire is of layer trait B, and after delay simulation (one can use any delay calculator, such as SPICE, or Elmore Delay), it is found that one wire is better than the other wire with regard to performance and timing, and has the same or less resource cost (area, power, etc.), then lesser wire is redundant with regard to the better performing wire.

For example, in the depicted example, the layer traits W20S20L17 B1 X3 and W30S15L17 B1 X3 are redundant due to the layer ranges being the same, i.e. B1 to X3, the number of tracks used, delay and timing, and resource costs. That is, looking at these two layer traits, it is determined that these two layer traits cover a same layer range [B1, X3]. The wirecodes indicate that the W20S20 layer trait uses 4 tracks and the W30S15 uses 4.5 tracks (W30S15 indicates a 3× width wiring layer with a 1.5× spacing). Through timing simulation, it can be determined that W20S20 layer trait has a better delay and timing performance than the W30S15 layer trait. Moreover, the W20S20 uses less area and thus, has a lower resource cost. Therefore, W20S20 is the better layer trait to keep and the W30S15 layer trait may be pruned as a redundant layer trait.

In considering which of these two redundant layer traits to keep in the first pruned layer trait list 520, various characteristics such as time of flight, reach limit, coupling timing, routing cost, and the like may be considered as part of the analysis. In this context, the time of flight means, given a very long wire, and if there is ideal buffering, the delay/mm for this wirecode. Reach limit means, for a given slew limit, how far a wire can go without another buffer on this layer trait. Coupling timing means time-of-flight/reach limit when one considers coupling capacitance. Route cost is generally the wire pitch of this layer trait. For example, between the two layer traits W20S20L17 B1 X3 and W30S15L17 B1 X3, the time of flight, reach length, coupling, and routing cost of W20S20L17 are better than the W30S15L17 layer trait. Thus, of these two redundant layer traits, the one to keep in the pruned layer trait listing 520 is the W20S20L17 B1 X3 layer trait.

This first pruned layer trait listing 520 comprises those layer traits that are not redundant with regard to RC parasitics for the most part. In the depicted example, the first pruned layer trait listing 520 comprises 7 layer traits. It should be appreciated that the first pruned layer trait listing 520 may include some redundancies when there are unbalanced stacks. These redundancies may be for boundary layer traits that are kept in the first pruned layer trait listing 520. For example, assume there are layers B1 B2 B3 E1, which means that there are three 2× layers and one 4× layer, and one needs to have a "B3 E1" pair, with W20S20L18, assuming there are five 1× layers and three 2× layers. "W20S20L18 B3 E1" means there are is a 2× layer "B3" and a 1× layer "E1." This will achieve a better balance of RC parasitics since there is only one 4× layer.

A second pruned layer trait listing 530 may be generated by further pruning the first pruned layer trait listing 520 to remove layer traits having the same or similar congestion. The congestion may be measured based on the wiring resources used for each layer trait. For example, W20S20 takes 4 tracks, and W10S10 takes 2 tracks.

In the depicted example, pruning based on same or similar congestion levels, results in a second pruned layer trait listing 530 that has 4 layer traits. The choice as to which layers, having the same or similar congestion levels, to maintain in the second pruned layer trait listing 530 may be performed based on delay and all other statistics as previously described above. For example, the methodology may select a layer trait based only on the non-coupling timing and choose the layer trait having the best non-coupling timing. Alternatively, the methodology may choose a layer trait to maintain based on routing area, timing cost, and/or the like. Any combination of one or more of the characteristics previously discussed, or other types of wire characteristics may be used as a decision point for selecting one layer trait over another to keep in the second pruned layer trait listing 530.

A third pruned layer trait listing 540 may be generated by further pruning the second pruned layer trait listing 530 such that there is single layer trait to cover each layer of the technology metal stack. If more than one layer trait is available to select from, the selection of a single layer trait to cover layers may be arbitrary, for example. As shown in FIG. 5, in this example, this results in 2 layer traits.

Each of these layer trait listings 510-540 has a different level of granularity. The verbose full layer trait listing 510 has the finest granularity since the full spectrum of layer traits is available for consideration. The third pruned layer trait listing 540 representing the coarsest granularity since only two possible layer traits are present for consideration during wire routing and synthesis. As such, the third pruned layer trait listing 540 is beneficial to use early on during the wire routing and synthesis operations (such as placement, latch movement, buffering, resizing and vt optimization) while the first pruned layer trait listing 520 may be better used in the latter stages of the wire routing and synthesis operations in order to increase the speed by which this routing and synthesis may be performed.

Figure 6:
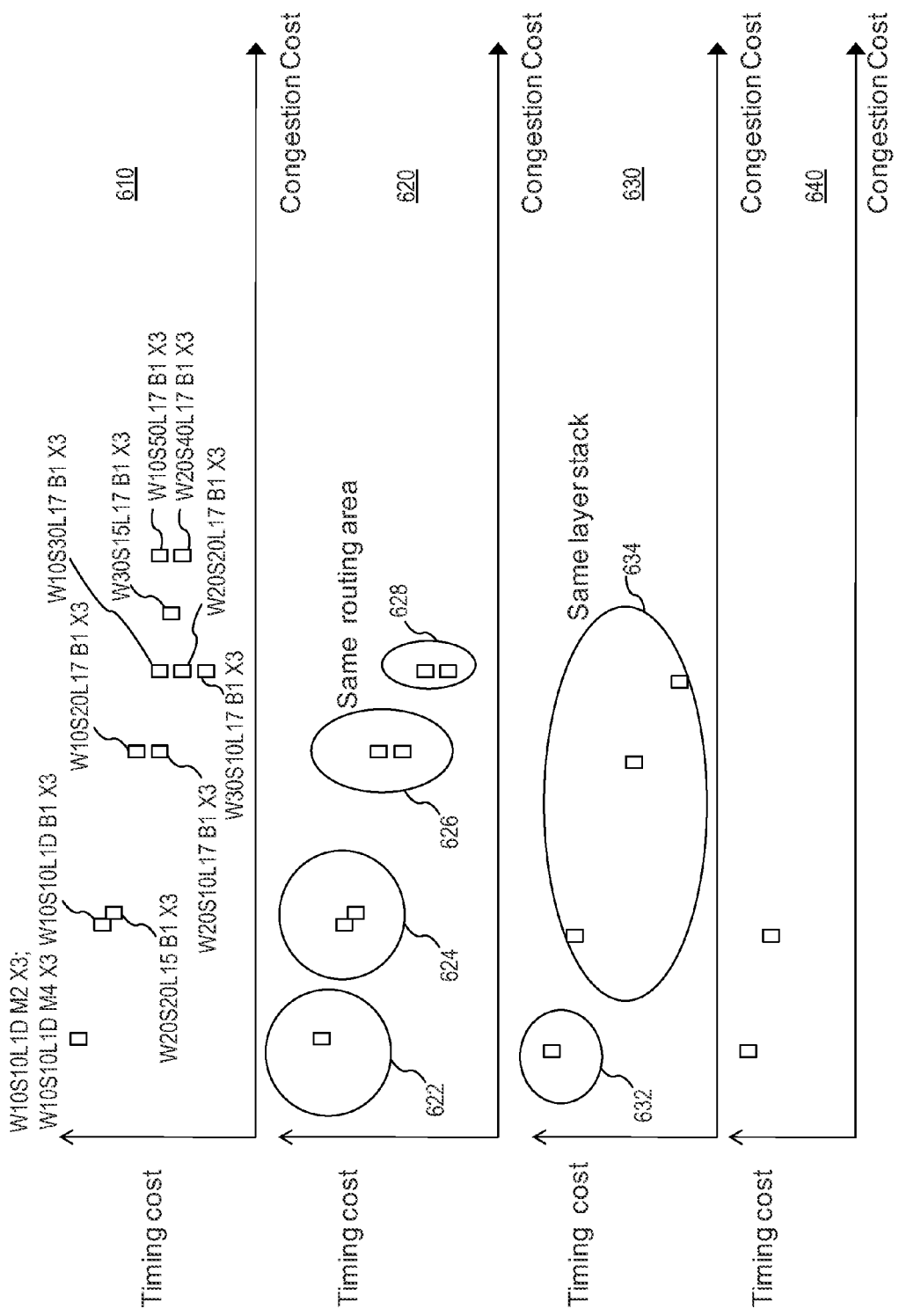
FIG. 6 illustrates plots 610-640 of layer traits for further illustrating the pruning process at different levels of pruning in accordance with one illustrative embodiment.

FIG. 6 illustrates plots 610-640 of layer traits for further illustrating the pruning process at different levels of pruning in accordance with one illustrative embodiment. Plot 610 in FIG. 6 represents an initial verbose full layer trait listing with the layer traits plotted according to their timing cost (or time of flight) on the y-axis and congestion costs on the x-axis. It should be appreciated that while FIG. 6 illustrates two-dimensional plots 610-640, the actual number of characteristics considered may result in a three or more multi-dimensional analysis as described hereafter. The plots 610-640 in FIG. 6 are shown as two dimensional simply to make it easier to depict the plots and for ease of understanding.

As shown in plot 610 in FIG. 6, various ones of the layer traits have the same or similar timing costs and congestion costs. Redundancy of layer traits may be determined, for example, by considering layer traits having a same or similar congestion cost to be redundant, same or similar routing area, same layer group, and/or the like. In one illustrative embodiment, if two or more layer traits have a same or similar routing area, or a same or similar layer group, then the two or more layer traits are considered to be redundant and one or more of these may be selected for pruning based on relative timing costs and wire congestion. Thus, looking at sets 624, 626, and 628 in FIG. 6, for example, in each of these sets, which are based on having a same or similar routing area, there are layer traits that have timing costs and congestion costs that are close, i.e. within a predetermined tolerance of one another, in which one of the layer traits has a timing cost and/or congestion that is higher than the other. In such a case, one of these two layer traits is redundant with regard to the other layer trait. For example, in set 624, one layer trait (the right most layer trait) has a higher congestion but lower timing cost and the other layer trait has a higher timing cost and lower congestion. In sets 626 and 628, the two layer traits have a same congestion but one layer trait has a higher timing cost than the other. In this case, the layer trait in 624 having a higher timing cost but lower congestion is selected (i.e. layer trait W10S10L1D B1 X3) while in sets 626 and 628, the layer traits having the lower timing costs (i.e. layer traits W20S10L17 B1 X3 and W30S10L17 B1 X3) are selected, as shown in set 634, which is based on layer traits having a same layer group.

As shown in plot 620 of FIG. 6, some of these redundant layer traits are removed from the layer trait listing to generate a first pruned layer trait listing. It should be appreciated that not all of the redundant layer traits are necessarily removed, since other criteria, such as coupling timing, routing cost, and the like, may be considered to determine whether to keep the layer trait in the first pruned layer trait listing or not. For example, if one layer trait has a better relative coupling timing than another, but the other layer trait has a better relative routing cost, then both layer traits may be kept in the first pruned layer trait listing in order to be able to consider both optimizations during wire routing and synthesis.

It should be noted that with regard to plot 620, the sets 622-628 are determined based on layer traits having a same or similar routing area. A same or similar routing area refers to the layer traits having a same or similar routing area on most layers of the layer trait. For example, W10S20L17 B1 X3 and W20S10L17 B1 X3, both use 3 tracks on B layers and below, and two track on layer 8 and above. For W10S10L1D B1 X3 and W20S20L15 B1 X3, these layer traits have a same routing resource for layer 6 and above. For layers 1 to 5, which are generally only vias for this particular layer trait, the routing resource is 2 tracks versus 4 tracks, but since they are just vias, the overall congestion cost are still similar.

Plot 630 in FIG. 6 shows the second level of pruning performed by the mechanisms of the illustrative embodiment in which layer traits having the same or similar congestion costs are pruned. Thus, looking at the first region 622 in plot 620, only one layer trait is present and thus, it is selected for inclusion in the second pruned layer trait listing represented in plot 630. The second region 624 in plot 620 has two layer traits having similar congestion costs and thus, one of these two layer traits is selected for inclusion in the second pruned layer trait listing depicted in plot 630. The same is true for regions 626 and 628 which each have more than one layer trait having the same congestion costs. Generally, the layer trait to keep in the pruned layer trait set may be selected based on a number of factors including timing costs and other characteristics as previously discussed above.

In a third level of pruning, representative layer traits for the same layer group are selected from those present in the second pruned layer trait listing represented in plot 630 to thereby generate those present in plot 640. As shown in plot 630, there is a single layer trait covering the portion of the layer group 632 and three layer traits that cover the portion of the layer group 634. Since there is only one layer trait for the portion of layer group 632, it is selected for inclusion in the third pruned layer trait listing. Since there are three layer traits for the portion of the layer group 634, any of these may be selected arbitrarily for inclusion in the third pruned layer trait listing.

As mentioned above, the various levels of pruning performed by the mechanisms of the illustrative embodiments provide different levels of coarseness with regard to the wire routing and synthesis operations. As such, different ones of the first, second, and third pruned layer trait listings, or libraries, may be used at different stages of the wire routing and synthesis operations.

That is, going from the bottom up, the third pruned layer trait listing provides the lowest accuracy with regard to wire routing, but can be applied on a larger scale without dramatically impacting runtime of the wire routing and synthesis operations. This third pruned layer trait list may be used, for example, with optimizations using Steiner tree based wiring of large scale portions of an integrated circuit design and with relatively less accurate timing delay model, such as an Elmore delay approximation model. The second pruned layer trait list, or library, may be used with optimizations using Steiner tree/global wiring based wiring of medium scale regions of the integrated circuit design with the use of a more accurate timing delay model, such as the RICE delay model. The first pruned layer trait list may be used with optimizations using detailed wiring of relatively small regions of the integrated circuit design and a more accurate timing delay model, such as RICE or the like. Thus, as one traversed from bottom to top with regard to the pruned layer trait listings, the third pruned layer trait list represents the least accurate but fastest listing with regard to use in performing wire routings and synthesis, while the first pruned layer trait list represents the most accurate but slowest listing with regard to use in performing wire routings and synthesis.

Figure 7:
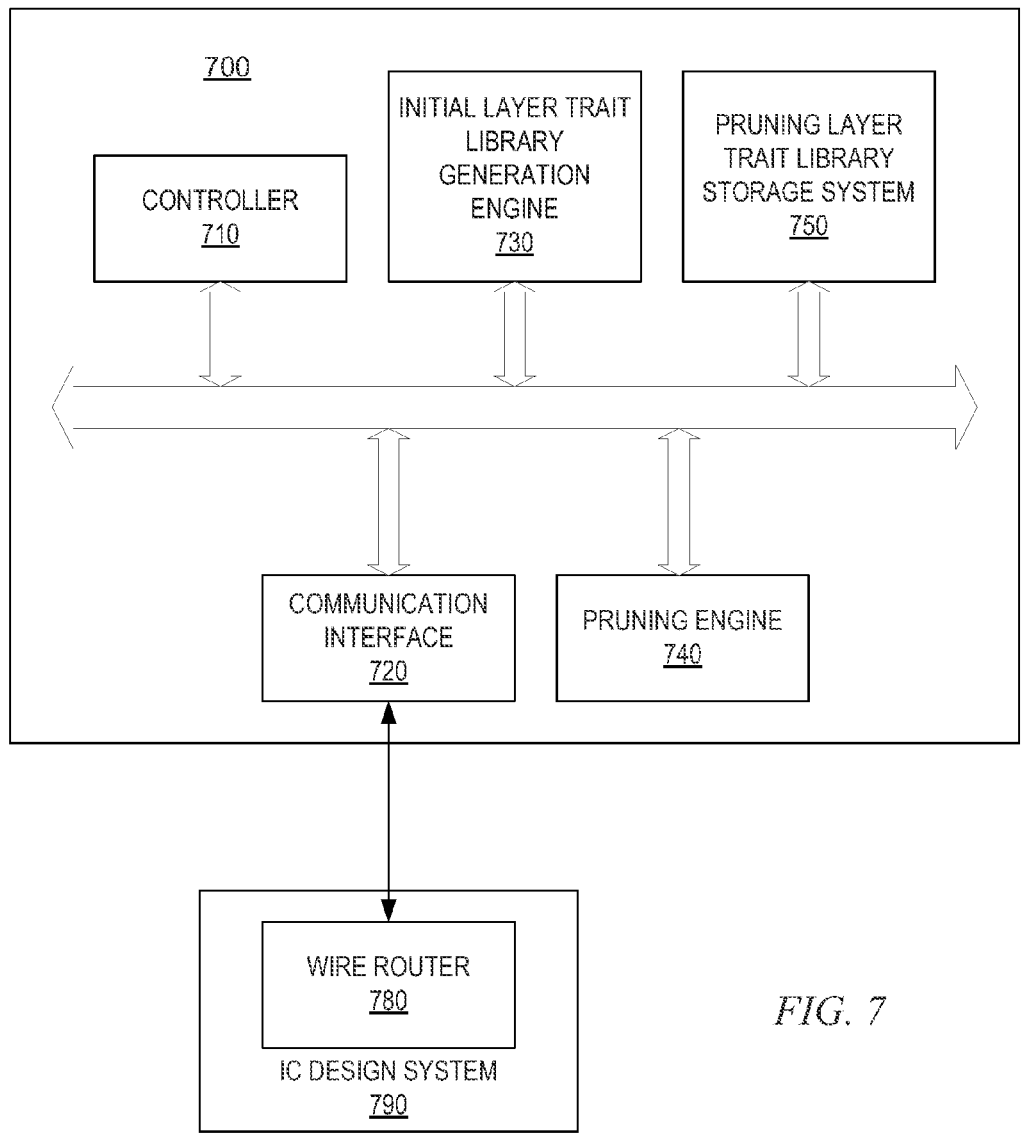
FIG. 7 is an example block diagram of a layer trait library pruning engine in accordance with one illustrative embodiment.

FIG. 7 is an example block diagram of a layer trait library pruning engine in accordance with one illustrative embodiment. The elements shown in FIG. 7 may be implemented in hardware, software, or any combination of hardware and software. In one illustrative embodiment, the elements shown in FIG. 7 are implemented as software instructions loaded into one or more memories and then executed by one or more processors of one or more data processing systems. For example, the layer trait library pruning engine may work with, as a preprocessor to, or as part of, a wire routing mechanism of an integrated circuit design system. The layer trait library pruning engine may be integrated into the integrated circuit design system or may be a separate component that is communicatively coupled to the integrated circuit design system and may exchange information with the integrated circuit design system through one or more interfaces. It should be appreciated that one or more of the components in FIG. 7 may instead be implemented as hardware logic, such as in an Application Specific Integrated Circuit (ASIC) or the like.

As shown in FIG. 7, the layer trait library pruning engine 700 comprises a controller 710, a communication interface 720, an initial layer trait library generation engine 730, a pruning engine 740, and a pruned layer trait library storage system 750. The controller controls the overall operation of the layer trait library pruning engine 700 and orchestrates the operation of the other elements 720-750. The communication interface 720 provides a communication pathway through which data may be received and transmitted or passed to other computing devices, other software modules, output to users, or the like.

For example, through the communication interface 720, a technology stack specification may be provided to the layer trait library pruning engine 700 along with a listing of possible wirecodes that may be used in the integrated circuit design. The designation of the technology stack specification and listing of possible wirecodes may be provided, for example, by a user via a user interface or client computer, an automated tool, such as an integrated circuit design system, as part of the input of a design specification, or the like. The providing of this information to the layer trait library pruning engine 700 may be in response to the initialization of an integrated circuit design operation, such as a wire routing and synthesis operation, in response to a specific request to generate pruned layer trait libraries for use with the integrated circuit design process, or the like, provided by a user, automated tool, or the like.

Under the direction of the controller 710, the initial layer trait library generation engine 730 performs an operation for building the initial layer trait library based on the specification of the technology stack and the possible wirecodes for the integrated circuit design. That is, the initial layer trait library generation engine 730 generates a verbose full layer trait library comprising an entry for each possible combination of layer stack range and wirecode. The layers in the stack may be determined from the specification of the technology stack and the wirecodes may be determined from the designation of the possible wirecodes passed to the layer trait library pruning engine 700 or already stored in the layer trait library pruning engine 700, such as a default set of wirecodes or the like.

Thus, for example, assuming there are M layers in the technology stack, i.e. layers $L_1, L_2, L_3, \ldots, L_M$, then there are layer ranges $[L_1, L_M], [L_2, L_M], \ldots, [L_{M-1}, L_M]$. Examples of layer ranges include [M3 X3], [B1 X3], [E1 X3], etc. Assuming that the maximum wire width supported by the wiring router of the integrated circuit design system is K, and K also defines the maximum spacing and via width, then there are $K^2$ combinations of wirecode for each layer, where the wirecode is defined by [W, S] where W is the width which may be set from 1 to K, and S is the spacing which may be set from 1 to K. In addition, each layer has K possible choices for via width. Given M metal layers and the maximum wire width K supported by the wiring router, there are $O(M*K^M)$ possible combinations considering all possible via stacks as well. Thus, the initial layer trait library generation engine 730 generates this initial layer trait library using these various combinations of wirecode and layer ranges.

The pruning engine 740 performs the operations of the illustrative embodiments with regard to pruning the initial layer trait library into one or more pruned layer trait libraries. These pruned layer trait libraries provide various levels of coarseness and accuracy with regard to wire routings and may be provided for use at various stages of an integrated circuit design process or flow.

The pruning engine 740, in order to perform the pruning operation first groups all layers having the same RC parasitic. The RC parasitic of the various layers may be specified in a technology manual, as the result of a SPIC simulation, or the like. For example, referring again to FIG. 4, all of layers M1 to M5 are considered to have the same RC parasitic characteristics, all layers B1 to B2 are considered to have the same RC parasitic characteristics, etc.

Assuming that this grouping generates N unique RC groups, $[L_1, \ldots, L_{d\_1}], [L_{d\_1+1}, \ldots, L_{d\_2}], [L_{d\_\{N-1\}+1}, \ldots L_M]$, the pruning engine 740 pruned down from M layer ranges to N layer ranges. For example, the layer range [M2 X3] prunes all layer ranges [M3 X3], [M4 X3], [M5 X3]. Similarly, layer range [B1 X3] prunes layer ranges [B2 X3] and [B3 X3]. It should be noted, however, that if there are unbalanced layer stacks, the boundary layer ranges may be kept and not pruned, e.g., if there is only one E1 layer, then the layer range [B3 X3] may be kept. Thus, layer traits having layer ranges that are pruned in this manner may be eliminated from a first pruned layer trait library generated by the pruning engine 740, e.g., a layer trait having the layer range [M2 X3] may be kept as part of the first pruned layer trait library while other layer traits in the initial layer trait library having layer ranges [M3 X3], [M4 X3], [M5 X3] are removed and not included in the first pruned layer trait library. Only layer traits having layer ranges that are encompassed by layer traits having other layer ranges may be eliminated in this way.

To reduce wiring router complexity and maximize the runtime savings by utilizing the pruning mechanisms of the illustrative embodiments, the pruning engine 740 prunes any complicated via stacks. That is, the via stack for layers under the layer range should be either uniform (the same for all such layers under the layer range) or monotonically increasing/decreasing. If a layer trait specifies a via stack does not meet these criteria, then the layer trait may be removed from inclusion in the first pruned layer trait library. For example, if the layer range is [B1 X3], all M1 to M5 layers either should have the same via width, or a monotonically changing via width, e.g., 2× wide via on layer M2, 3× wide via on layer M3, 4× wide via on layer M4, or vice versa.

Layers above the lower bound L and layer L+1 use a default wirecode since the default wirecode prunes all other combinations with better congestion and same Steiner timing. For example, for layer range [B1 X3], the wirecode specified in the layer trait only applies to layers M1 to B2 (layer L+1). Layers B3 to X3 all assume a default wire coding of a single width and single spacing. The application of the layer traits to only the L and L+1 layers relies on the assumption that Steiner timing is only looking at the L and L+1 layers. So, for example, if the layer trait specifies double width, double spacing for X1 now, since Steiner timing is still the same (since only B1 and B2 matters here), and routing cost is higher compared to single width, single spacing on X1, it is determined that there is no need to define complicated wire width, spacing for X1, which is redundant already.

The remaining layer traits in the layer trait library are then pruned based on congestion and timing characteristics. For example, the congestion may be defined as the number of tracks specified by the wirecode of a layer trait. The timing may be defined in terms of time of flight (ps/mm), reach length for slew constraints, time of flight with coupling, and the like. For two layer traits, one layer trait dominates the other one if all metrics are better than the other one. For example, if Q is timing and W is congestion, then if Qi<Qj and Wi>Wj, the layer trait I is redundant because no one trait dominates the other. As a more concrete example, consider two layer traits in which both layer traits have the same routing pitches (3 tracks) on B layers and via stacks. Assume that one layer trait, W10S20L17 B1 X3, has a timing parameter of 81 ps/mm, and that the other layer trait, W20S10L17 B1 X3, has a timing parameter of 70 ps/mm. In this scenario, the first layer trait W10S20L17 B1 X3 prunes the second layer trait W20S10L17 B1 X3 since the first layer trait has better timing metrics. However, if the second layer trait has a better nominal timing, but the first layer trait has a better coupling timing, then both layer traits would need to be kept in the pruned layer trait library rather than eliminating the second layer trait. Another example may be that the layer trait W20S20LBD X1 X3 prunes the layer trait W30S15LBD X1 X3 since it has better time of flight (45 ps/mm versus 48 ps/mm) and less routing tracks, as may be determined from a time of flight simulation, based on ideal buffering on a long net with one layer trait. For example, if there is a 10 mm wire, and it is determined that the ideal buffering is inserting a buffer every 0.5 mm, then the delay of the 10 mm wire given the best buffering can be computed in terms of ps/mm by using delay/10 mm, as is generally known in the art.

The above operation by the pruning engine 740 results in a first pruned layer trait listing or library in which redundant layer traits are removed or pruned out. The pruning engine 740 may then perform a middle level clustering on the first pruned layer trait library to generate a second pruned layer trait library. The middle level clustering may involve, for example, finding all layer traits with significant different RC parasitic. The "significance" of a difference in RC parasitic may be determined based on a predetermined threshold defining a value at or above which the difference is considered to be significant. For example, if the time of flight difference is only 1 ps/mm, then the difference may be considered small, but if the difference is 5 ps/mm, then the difference may be considered significant, where the threshold may be 4 ps/mm, for example.

The result of the middle level clustering is a set of clusters of layer traits having similar RC parasitics. In each cluster, one layer trait for each wire width (wire pitch) value is selected for inclusion in the second pruned layer trait library. To select a layer trait for each wire width (or wire pitch) if more than one layer trait is present for each wire width, the nominal timing may be used instead of coupling timing to select the layer trait to retain and prune the other layer traits. Moreover, if any of the layer traits have via stacks specified, then they may be pruned out.

The pruning engine 740 may then generate a third pruned layer trait library from the second pruned layer trait library by choosing a single/default layer trait for each layer group (for example, there may be a single 13 layer stack with 4 layer groups, where each layer group has the same RC parasitic value such that M1 to M4 have one RC parasitic value, followed by a layer group comprising all 2S layers, a layer group comprising all 4× layers, and a layer group comprising all 8× layers). For each unbalanced layer in the layer stack, a single layer trait is selected. For each other layer, the selected layer trait may be arbitrarily selected.

Thus, the pruning engine 740 provides multiple levels of pruned layer trait libraries for use by the wire router of the integrated circuit design system when performing various levels of wire routings, as previously discussed above. These pruned layer trait libraries may be stored in the pruned layer trait library storage system 750 for later use. For example, these pruned layer trait libraries may be provided to a wire router 780 of an integrated circuit design system 790, via the communication interface 720, for use in performing wire routing at various levels during the integrated circuit design process or flow.

Thus, the illustrative embodiments provide mechanisms for pruning the verbose full layer trait library into relatively smaller sized layer trait libraries that reduce the runtime of the wire routing due to the smaller size of libraries having to be processed. The illustrative embodiments perform the pruning by removing redundant layer traits from the verbose full layer trait library and then performing clustering to generate additional layer trait libraries having different levels of granularity.

Figure 8:
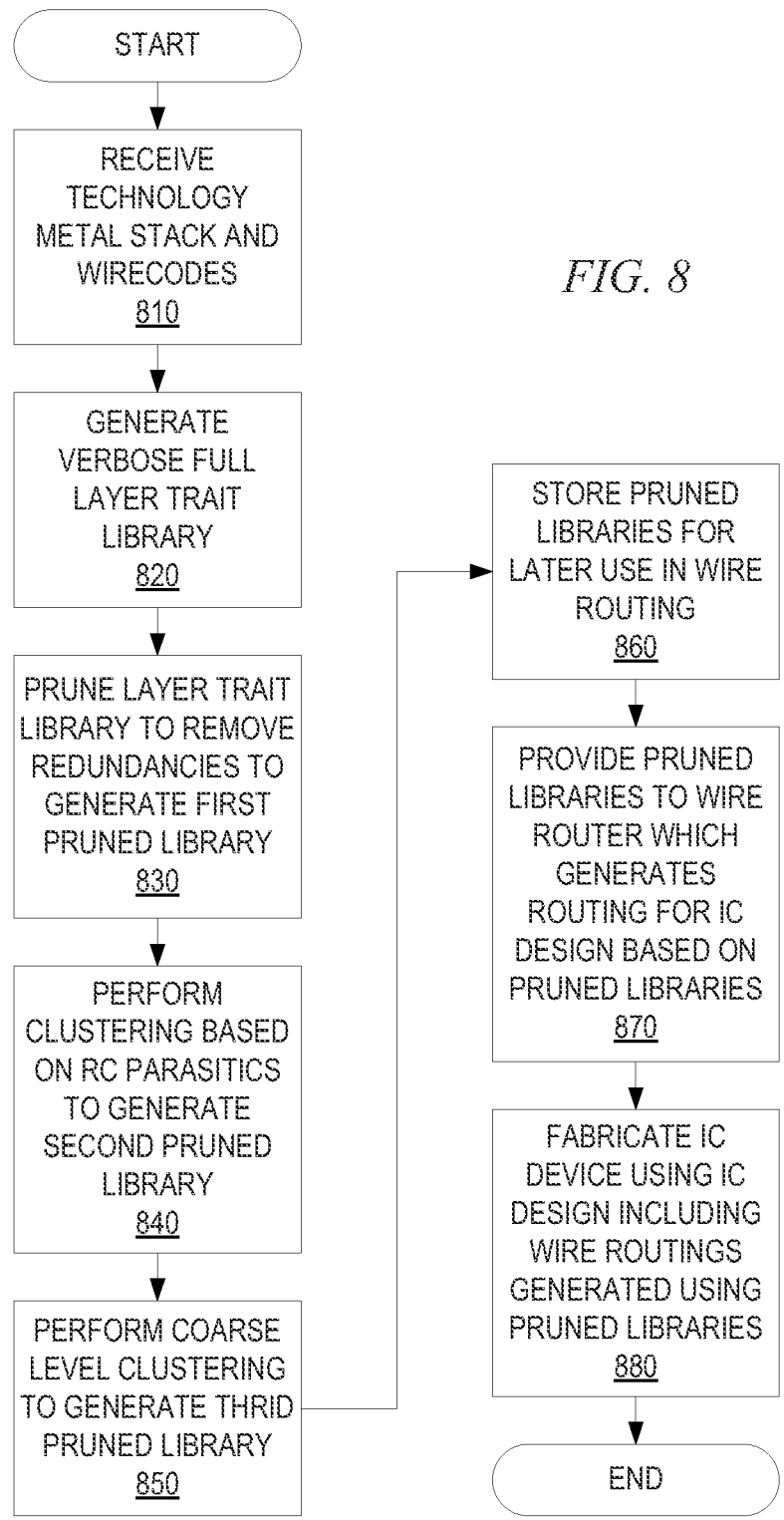
FIG. 8 is a flowchart outlining an example operation for pruning a layer trait library in accordance with one illustrative embodiment.

FIG. 8 is a flowchart outlining an example operation for pruning a layer trait library in accordance with one illustrative embodiment. As an example, the operation outlined in FIG. 8 may be implemented by a layer trait library pruning engine, such as shown in FIG. 7, either as a preprocessing operation or as part of a wire routing and synthesis operation during the design of an integrated circuit device for manufacture.

As shown in FIG. 8, the operation starts by receiving an identification of a technology metal stack and the wirecodes that can be used when performing wire routings (step 810). A verbose full layer trait library is built using all of the possible combinations of layer ranges and wirecodes (step 820). The full layer trait library is pruned to remove redundant layer traits and generate a first pruned layer trait library (step 830). A middle level clustering is performed on the first pruned layer trait library based on RC parasitics such that within a cluster of layer traits having similar RC parasitics, a layer trait is selected for inclusion for each wire width (step 840). This results in a second pruned layer trait library. A coarse-level clustering is performed on the second pruned layer trait library to thereby select a single/default layer trait for each layer stack and thereby generate a third pruned layer trait library (step 850). The various pruned layer trait libraries are stored for later use during wire routing (step 860). At some time thereafter, the pruned layer trait libraries are provided to a wire router which uses the various pruned layer trait libraries at different levels of wire routing granularity to generate an integrated circuit design (step 870). The resulting integrated circuit design may then be output to a manufacturing system for actually manufacturing the integrated circuit device (step 880).

The mechanisms as described above are used in the fabrication of integrated circuit chips. In particular, the mechanisms of the illustrative embodiments may be used to generate layer trait libraries used during the wire routing operations of an IC design flow which results in a fabricated integrated circuit chip or device. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, handheld computing devices, personal digital assistants, communication devices, such as wireless telephones and the like, laptop computing devices, desktop computing devices, server computing devices, or any other computing device.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system comprising at least one processor and at least one memory, for pruning a layer trait library for use in wire routing in an integrated circuit design process, comprising the following operations performed by the data processing system:
  receiving a plurality of wirecodes and a metal stack definition;
  generating a verbose layer trait library based on all possible combinations of the wirecodes and layers of the metal stack definition, wherein generating the pruned layer trait library comprises:
    pruning the verbose layer trait library to remove redundant layer traits to generate a first pruned layer trait library, wherein pruning the verbose layer trait library to remove redundant layer traits comprises:
- identifying layer traits in the verbose layer trait library having a similar resistance-capacitance (RC) characteristic to generate one or more layer trait groups having a similar RC characteristic; and
- selecting a representative layer trait from each group of the one or more layer trait groups to represent the layer traits in the group to be included in the first pruned layer trait library;

performing clustering of layer traits in the first pruned layer trait library; and pruning the first layer trait library based on the clustering of layer traits in the first pruned layer trait library to generate a second pruned layer trait library;

generating a pruned layer trait library by pruning the verbose layer trait library to remove redundant layer traits from the verbose layer trait library;

storing the pruned layer trait library for performing wire routing of an integrated circuit design; and fabricating an integrated circuit device based on the integrated circuit design, including the wire routing performed based on the stored pruned layer trait library.

2. The method of claim 1, further comprising performing wire routing of the integrated circuit design based on the stored pruned layer trait library.

3. The method of claim 1, wherein the representative layer trait that is selected from each group is selected based on one or more of resource costs associated with the layer traits in the group, delay and timing characteristics of the layer traits in the group, time of flight of layer traits in the group, reach limit of layer traits in the group, coupling timing of traits in the group, or routing cost of layer traits in the group.

4. The method of claim 1, wherein generating the pruned layer trait library further comprises:
- performing clustering of layer traits in the second pruned layer trait library; and
- pruning the second pruned layer trait library based on the clustering of layer traits in the second pruned layer trait library to generate a third pruned layer trait library.

5. The method of claim 4, wherein:
- performing clustering of layer traits in the second pruned layer trait library comprises clustering layer traits according to similar congestion levels such that one or more clusters of layer traits are generated where each cluster has layer traits having a similar congestion level, and
- pruning the second pruned layer trait library based on the clustering of layer traits in the second pruned layer trait library to generate a third pruned layer trait library comprises pruning each of the clusters in the one or more clusters.

6. The method of claim 5, wherein pruning the second pruned layer trait library based on the clustering of layer traits in the second pruned layer trait library to generate a third pruned layer trait library comprises selecting, from each cluster in the one or more clusters, a representative layer trait from the layer traits of the cluster based on at least one of resource costs or timing and delay characteristics of the layer traits of the cluster.

7. The method of claim 4, further comprising:
- performing a wire routing process on the integrated circuit design using the first, second, and third pruned layer trait libraries, where each of the first, second, and third pruned layer trait libraries are used at a different granularity of the wire routing process.

8. The method of claim 7, wherein the third pruned layer trait library is used at a coarsest level of granularity of the wire routing process and the first pruned layer trait library is used at a finest level of granularity of the wire routing process.

9. The method of claim 1, wherein the layer traits each comprise a combination of wirecode and layer range.

10. A computer program product comprising a computer readable storage medium having a computer readable program stored therein, wherein the computer readable program, when executed on a computing device, causes the computing device to:
- receive a plurality of wirecodes and a metal stack definition;
- generate a verbose layer trait library based on all possible combinations of the wirecodes and layers of the metal stack definition, wherein the computer readable program causes the computing device to generate the pruned layer trait library at least by:
  - pruning the verbose layer trait library to remove redundant layer traits to generate a first pruned layer trait library, wherein the computer readable program causes the computing device to prune the verbose layer trait library to remove redundant layer traits at least by:
    - identifying layer traits in the verbose layer trait library having a similar resistance-capacitance (RC) characteristic to generate one or more layer trait groups having a similar RC characteristic; and
    - selecting a representative layer trait from each group of the one or more layer trait groups to represent the layer traits in the group to be included in the first pruned layer trait library;
  - performing clustering of layer traits in the first pruned layer trait library; and
  - pruning the first layer trait library based on the clustering of layer traits in the first pruned layer trait library to generate a second pruned layer trait library;
- generate a pruned layer trait library by pruning the verbose layer trait library to remove redundant layer traits from the verbose layer trait library;
- store the pruned layer trait library for performing wire routing of an integrated circuit design; and
- fabricate an integrated circuit device based on the integrated circuit design, including the wire routing performed based on the stored pruned layer trait library.

11. The computer program product of claim 10, wherein the computer readable program further causes the computing device to perform wire routing of the integrated circuit design based on the stored pruned layer trait library.

12. The computer program product of claim 10, wherein the representative layer trait that is selected from each group is selected based on one or more of resource costs associated with the layer traits in the group, delay and timing characteristics of the layer traits in the group, time of flight of layer traits in the group, reach limit of layer traits in the group, coupling timing of traits in the group, or routing cost of layer traits in the group.

13. The computer program product of claim 10, wherein the computer readable program further causes the computing device to generate the pruned layer trait library further at least by:
- performing clustering of layer traits in the second pruned layer trait library; and
- pruning the second pruned layer trait library based on the clustering of layer traits in the second pruned layer trait library to generate a third pruned layer trait library.

14. The computer program product of claim 13, wherein:
performing clustering of layer traits in the second pruned layer trait library comprises clustering layer traits according to similar congestion levels such that one or more clusters of layer traits are generated where each cluster has layer traits having a similar congestion level, and
pruning the second pruned layer trait library based on the clustering of layer traits in the second pruned layer trait library to generate a third pruned layer trait library comprises pruning each of the clusters in the one or more clusters.

15. The computer program product of claim 14, wherein pruning the second pruned layer trait library based on the clustering of layer traits in the second pruned layer trait library to generate a third pruned layer trait library comprises selecting, from each cluster in the one or more clusters, a representative layer trait from the layer traits of the cluster based on at least one of resource costs or timing and delay characteristics of the layer traits of the cluster.

16. The computer program product of claim 13, wherein the computer readable program further causes the computing device to:
perform a wire routing process on the integrated circuit design using the first, second, and third pruned layer trait libraries, where each of the first, second, and third pruned layer trait libraries are used at a different granularity of the wire routing process.

17. The computer program product of claim 16, wherein the third pruned layer trait library is used at a coarsest level of granularity of the wire routing process and the first pruned layer trait library is used at a finest level of granularity of the wire routing process.

18. The computer program product of claim 10, wherein the layer traits each comprise a combination of wirecode and layer range.

19. An apparatus, comprising:
a processor; and
a memory coupled to the processor, wherein the memory comprises instructions which, when executed by the processor, cause the processor to:
receive a plurality of wirecodes and a metal stack definition;
generate a verbose layer trait library based on all possible combinations of the wirecodes and layers of the metal stack definition, wherein the instructions cause the processor to generate the pruned layer trait library at least by:
pruning the verbose layer trait library to remove redundant layer traits to generate a first pruned layer trait library, wherein the instructions cause the processor to prune the verbose layer trait library to remove redundant layer traits at least by:
identifying layer traits in the verbose layer trait library having a similar resistance-capacitance (RC) characteristic to generate one or more layer trait groups having a similar RC characteristic; and
selecting a representative layer trait from each group of the one or more layer trait groups to represent the layer traits in the group to be included in the first pruned layer trait library;
performing clustering of layer traits in the first pruned layer trait library; and
pruning the first layer trait library based on the clustering of layer traits in the first pruned layer trait library to generate a second pruned layer trait library;
generate a pruned layer trait library by pruning the verbose layer trait library to remove redundant layer traits from the verbose layer trait library;
store the pruned layer trait library for performing wire routing of an integrated circuit design; and
fabricate an integrated circuit device based on the integrated circuit design, including the wire routing performed based on the stored pruned layer trait library.

* * * * *